United States Patent
Won et al.

(10) Patent No.: US 9,136,112 B2
(45) Date of Patent: Sep. 15, 2015

(54) METHOD OF POST TREATING GRAPHENE AND METHOD OF MANUFACTURING GRAPHENE USING THE SAME

(75) Inventors: Dong-Kwan Won, Changwon (KR); Seung-Min Cho, Changwon (KR); Jong-Hyuk Yoon, Changwon (KR); Doc-Hwa Na, Changwon (KR)

(73) Assignee: Hanwha Techwin Co., Ltd., Changwon (KR)

( * ) Notice: Subject to any disclaimer, the term of this patent is extended or adjusted under 35 U.S.C. 154(b) by 109 days.

(21) Appl. No.: 13/816,351

(22) PCT Filed: Aug. 5, 2011

(86) PCT No.: PCT/KR2011/005731
§ 371 (c)(1),
(2), (4) Date: Feb. 11, 2013

(87) PCT Pub. No.: WO2012/020950
PCT Pub. Date: Feb. 16, 2012

(65) Prior Publication Data
US 2013/0134384 A1 May 30, 2013

(30) Foreign Application Priority Data
Aug. 11, 2010 (KR) .................. 10-2010-0077491

(51) Int. Cl.
| H01L 21/31 | (2006.01) |
|---|---|
| H01L 21/02 | (2006.01) |
| B82Y 30/00 | (2011.01) |
| B82Y 40/00 | (2011.01) |
| C01B 31/04 | (2006.01) |
| H01L 29/16 | (2006.01) |

(52) U.S. Cl.
CPC ........... *H01L 21/02527* (2013.01); *B82Y 30/00* (2013.01); *B82Y 40/00* (2013.01); *C01B 31/0453* (2013.01); *C01B 31/0484* (2013.01); *H01L 29/1606* (2013.01)

(58) Field of Classification Search
CPC ............ H01L 21/0257; H01L 29/1606; H01L 29/66015; H01L 21/02606
USPC ...................... 438/759, 478, 758, 502; 257/9, 257/E21.347, 632; 977/734, 842, 742
See application file for complete search history.

(56) References Cited

U.S. PATENT DOCUMENTS

| 5,372,670 | A | 12/1994 | Cummings et al. | |
|---|---|---|---|---|
| 5,718,830 | A * | 2/1998 | Hlinka et al. | ............ 216/26 |
| 6,737,162 | B2 * | 5/2004 | Jonas et al. | ............ 428/413 |

(Continued)

FOREIGN PATENT DOCUMENTS

CN 101423209 A 5/2009

OTHER PUBLICATIONS

International Search Report (PCT/ISA/210), dated Mar. 28, 2012, issued by the International Searching Authority in counterpart International Application No. PCT/KR2011/005731.

(Continued)

*Primary Examiner* — Jarrett Stark
*Assistant Examiner* — Shahed Ahmed
(74) *Attorney, Agent, or Firm* — Sughrue Mion, PLLC

(57) ABSTRACT

Provided is a method of post treating graphene including providing graphene on a metal thin film, providing a carrier on the graphene, hardening the carrier, and removing the metal thin film from the graphene.

18 Claims, 7 Drawing Sheets

(56) References Cited

U.S. PATENT DOCUMENTS

| | | | |
|---|---|---|---|
| 2008/0317982 A1* | 12/2008 | Hecht et al. | 428/34.1 |
| 2009/0110627 A1 | 4/2009 | Choi et al. | |
| 2009/0213047 A1* | 8/2009 | Abe et al. | 345/76 |
| 2009/0308520 A1* | 12/2009 | Shin et al. | 156/60 |
| 2010/0021708 A1* | 1/2010 | Kong et al. | 428/220 |
| 2010/0101710 A1 | 4/2010 | Choi et al. | |
| 2010/0143726 A1 | 6/2010 | Golzh user et al. | |
| 2011/0206934 A1* | 8/2011 | Bol et al. | 428/408 |
| 2011/0244210 A1 | 10/2011 | Choi et al. | |
| 2011/0314840 A1* | 12/2011 | Jahangiri-Famenini | 62/56 |

OTHER PUBLICATIONS

Written Opinion (PCT/ISA/237), dated Mar. 28, 2012, issued by the International Searching Authority in counterpart International Application No. PCT/KR2011/005731.

Communication dated Jun. 5, 2014 from the State Intellectual Property Office of P.R. China in a counterpart application No. 201180039659.2.

* cited by examiner

METHOD OF POST TREATING GRAPHENE AND METHOD OF MANUFACTURING GRAPHENE USING THE SAME

CROSS-REFERENCE TO RELATED PATENT APPLICATION

This application claims priority from Korean Patent Application No. 10-2010-0077491, filed on Aug. 11, 2010, in the Korean Intellectual Property Office, the disclosure of which is incorporated herein by reference in its entirety.

BACKGROUND

1. Field

Apparatuses and methods consistent with exemplary embodiments relate to post treating graphene and manufacturing the graphene using the same.

2. Description of the Related Art

Carbon-based materials, such as nanotube, diamond, graphite, and graphene are studied in various nano technology fields. These carbon-based materials can be used in field effect transistors (FET), biosensors, nanocomposites, or quantum devices.

Graphene is a two dimensional material and is a semiconductor material having a band gap of zero. During the last few years, various studies with respect to electrical characteristics of the graphene have been published. The electrical characteristics of the graphene include a biopolar supercurrent, a spin transport, and a quantum hole effect. Graphene receives attention as a material that can be used for a basic unit for integration of carbon-based nano-electron devices.

As the interests with respect to graphene increase, there is a need to develop a method of manufacturing high quality graphene.

SUMMARY

One or more exemplary embodiments provide a method of manufacturing high quality graphene having improved electrical characteristics by greatly reducing resistance and also provide a method of manufacturing high quality graphene in a large scale.

According to an aspect of an exemplary embodiment, there is provided a method of post treating graphene, the method including providing graphene on a metal thin film; providing a carrier on the graphene; hardening the carrier; and removing the metal thin film from the graphene.

The post treating of graphene may be performed using a reel-to-reel method.

The metal thin film may have a panel-like shape, and the post treating of graphene may be performed while a transporting unit transports the metal thin film.

A frame may enclose the metal thin film.

A base member arranged on a surface opposite to the surface on which the graphene is formed supports the metal thin film.

The providing of the carrier may include supplying the carrier onto an outer surface of a coating roller; and coating the supplied carrier onto the metal thin film.

The providing of the carrier may include printing or coating the carrier on the graphene.

The carrier may be one selected from the group consisting of an acrylic material, a silicon-based material, and an epoxy-based material.

If the carrier is one selected from a group consisting of acrylic materials, the carrier may be polynethylmethacrylate (PMMA) or a water soluble acrylic resin.

If the carrier is one selected from a group consisting of silicon-based materials, the carrier may be polydimethylsiloxane (PDMS) or a silicon adhesive.

The hardening of the carrier may include hardening the carrier using a hardening device separated by a predetermined distance from the carrier which emits heat or light to the liquid phase carrier.

The removing of the metal thin film may include etching.

The method may further include, after the removing of the metal thin film, supplying a protective film; and providing the protective film on the graphene.

The method may further include removing the carrier.

The carrier may be a liquid phase carrier.

The hardening of the carrier may include hardening the carrier using a hardening device which does not apply pressure to the graphene.

The coating roller may not contact the carrier or the graphene.

According to an aspect of another exemplary embodiment, there is provided a method of manufacturing graphene including transporting a metal thin film to a graphene forming apparatus; providing graphene on the metal thin film; providing a carrier on a first surface of the graphene; hardening the carrier; removing the metal thin film from the graphene; and providing a protective film on a second surface of the graphene.

The post treating of graphene may be performed using a reel-to-reel method.

The metal thin film may have a panel-like shape, and the post treating of graphene may be performed while a transporting unit transports the metal thin film.

The providing of the carrier may include supplying the carrier onto an outer surface of a coating roller; and coating the supplied carrier onto the metal thin film.

The carrier may be at least one selected from the group consisting of PMMA, a water soluble acrylic resin, PDMS, a silicon adhesive, a water soluble epoxy resin, a modified epoxy resin, a water soluble polyurethane resin, a water soluble natural polymer resin, a water system adhesive, a visible light hardening adhesive, an infrared ray hardening adhesive, an electron beam hardening adhesive, a polybenzimidazole (PBI) adhesive, a polyimide adhesive, an imide adhesive, a bismaleimide (BMI) group adhesive, or a hot-melt adhesive.

The removing of the metal thin film may include removing the metal thin film by etching.

The method may further include removing the carrier from the graphene provided with the protective film.

The removing of the carrier may include melting the carrier in a solvent.

The removing of the carrier may include melting the carrier by submerging the carrier in the solvent in a container.

According to an aspect of another exemplary embodiment, there is provided a graphene post-treated according to the method of post treating graphene or the method of manufacturing graphene.

According to an aspect of another exemplary embodiment, there is provided an apparatus for manufacturing graphene including a transportation unit which transports a metal thin film throughout the apparatus; a graphene forming apparatus which receives the metal thin film from the transportation unit and disposes graphene on the metal thin film; a carrier coating unit which disposes a carrier on a first surface of the graphene; a hardening device which hardens the carrier; a metal film removing unit which removes the metal thin film from the graphene; and a protective film unit which disposes a protective film on a second surface of the graphene.

The transportation unit may include a plurality of reels.

The transportation unit may include a conveyer.

The carrier coating unit may include a coating roller which is disposed in a first predetermined distance from the thin metal film and does not apply pressure to the graphene.

The hardening device may be separated by a second predetermined distance from the carrier which and may emit heat or light to the carrier.

BRIEF DESCRIPTION OF THE DRAWINGS

The above and other aspects of the disclosure will become more apparent by describing in detail exemplary embodiments thereof with reference to the attached drawings in which.

DETAILED DESCRIPTION OF THE EXEMPLARY EMBODIMENTS

Reference will now be made in detail exemplary embodiments to exemplary embodiments, examples of which are illustrated in the accompanying drawings. The inventive concept may, however, be embodied in many different forms and should not be construed as being limited to the exemplary embodiments set forth herein; rather, these exemplary embodiments are provided so that this disclosure will be thorough and complete, and will fully convey the concept of the invention to one skilled in the art. The terminology used herein is for the purpose of describing particular exemplary embodiments only and is not intended to be limiting of the inventive concept. As used herein, the singular forms are intended to include the plural forms as well, unless the context clearly indicates otherwise. It will be further understood that the terms "comprise" and/or "comprising," when used in this specification, specify the presence of stated features, steps, operations, and/or components, but do not preclude the presence or addition of one or more other features, steps, operations, and/or components, and/or groups thereof. It will be understood that, although the terms first, second, third, etc., may be used herein to describe various elements, these elements should not be limited by these terms, and the terms are used for the purpose of distinguishing an element from another element.

Hereinafter, a method of manufacturing graphene will now be described with reference to the accompanying drawings. A method of post treating graphene according to an exemplary embodiment is described in operations of S130 through S170 of the method of manufacturing graphene, and thus, the descriptions of the method of post treating graphene will not be separately described.

Figure 1:
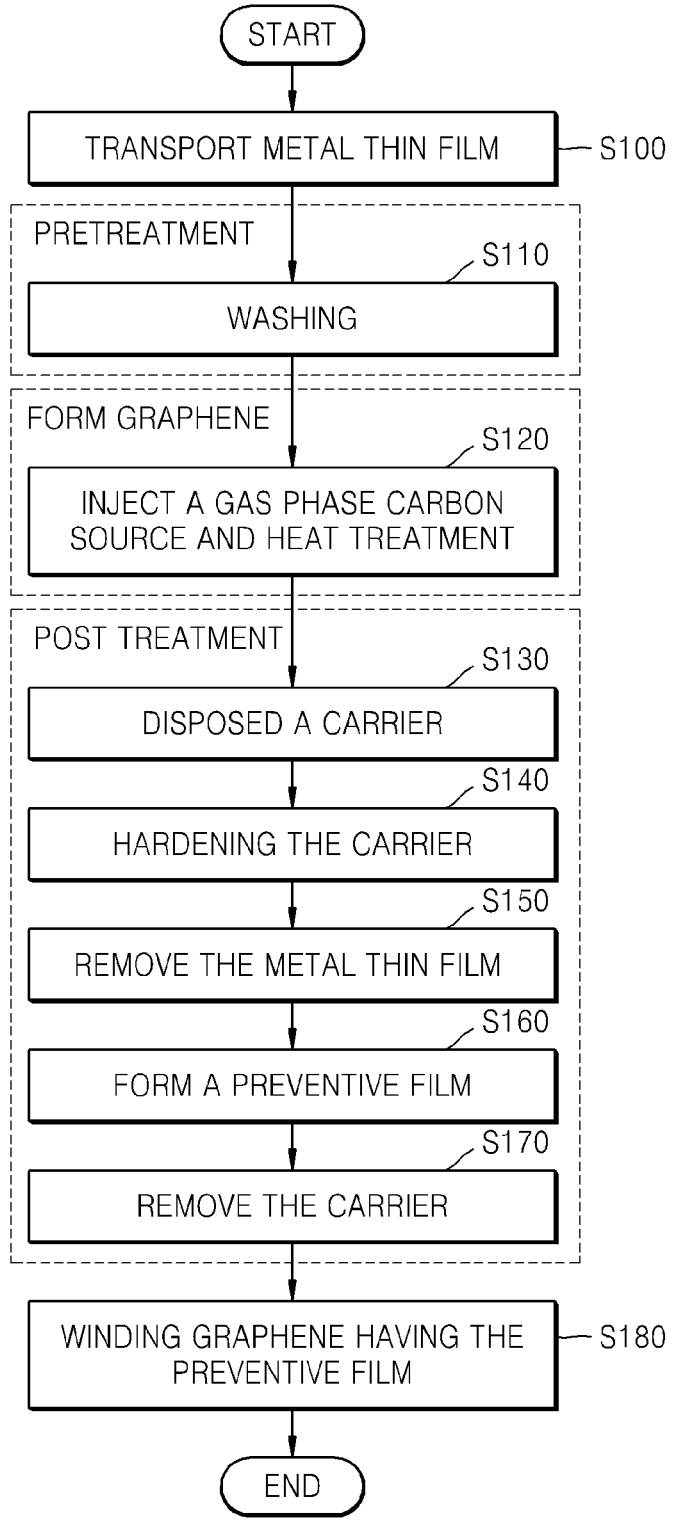
FIG. 1 is a flow chart illustrating a method of manufacturing graphene according to an exemplary embodiment.
Figure 2:
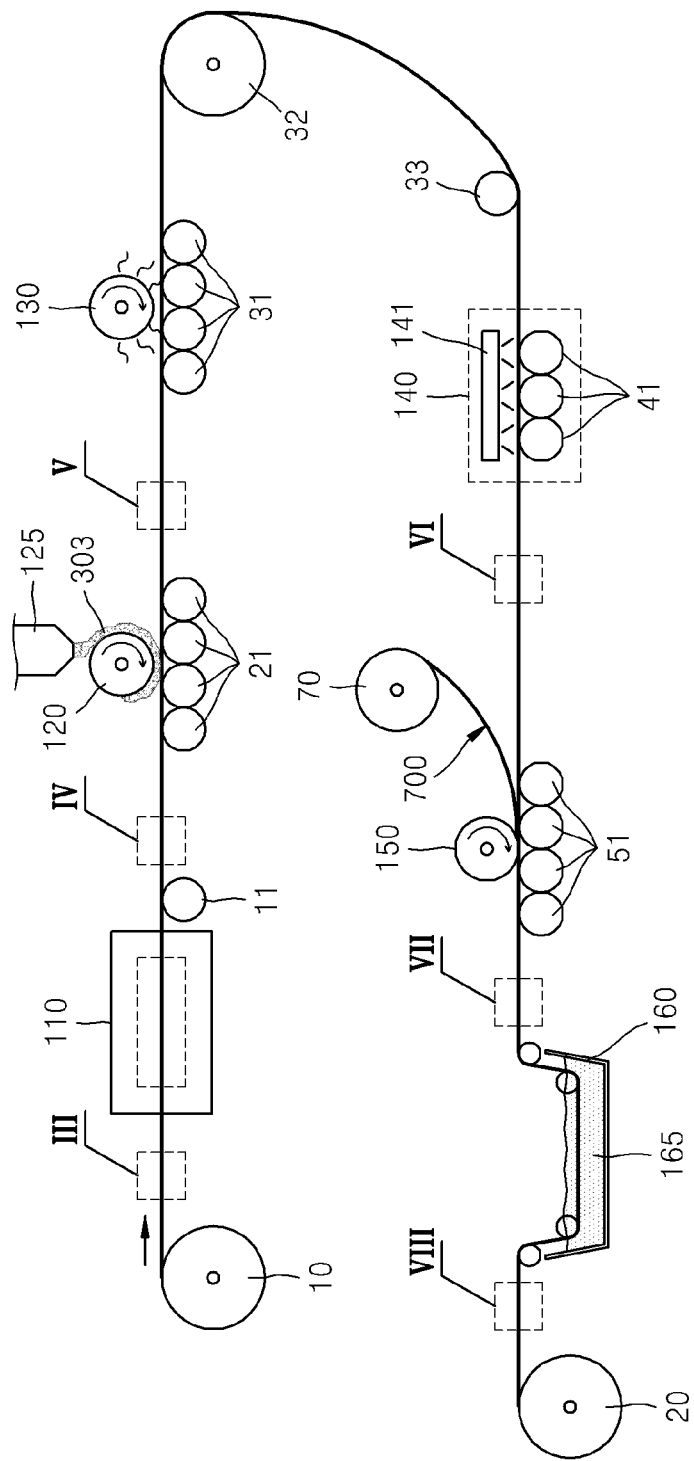
FIG. 2 is a schematic drawing showing the method of manufacturing graphene of FIG. 1 using a reel-to-reel method, according to an exemplary embodiment.

FIG. 1 is a flow chart illustrating a method of manufacturing graphene according to an exemplary embodiment and FIG. 2 is a schematic drawing illustrating manufacturing process according to the exemplary method of manufacturing graphene of FIG. 1.

In a transporting operation S100, a metal thin film 301 (shown in FIG. 3) is transported by using a reel 10. Referring to FIG. 2, the metal thin film 301 wound on the reel 10 is released and transported towards a graphene forming apparatus 110.

The metal thin film 301 may be formed of one selected from the group consisting of nickel (Ni), cobalt (Co), iron (Fe), platinum (Pt), gold (Au), aluminum (Al), chrome (Cr), copper (Cu), magnesium (Mg), manganese (Mn), molybdenum (Mo), rhodium (Ro), silicon (Si), tantalum (Ta), titanium (Ti), and tungsten (W).

Figure 3:
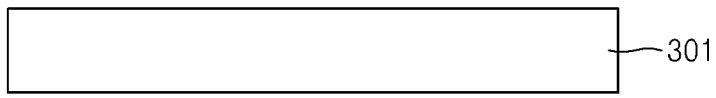
FIG. 3 is a schematic lateral cross-sectional view of a metal thin film transported according to a transportation operation of FIG. 1 and is a lateral cross-sectional view corresponding to a structure at a manufacturing stage III of FIG. 2, according to an exemplary embodiment.

In the current exemplary embodiment, the metal thin film 301 has a single film layer but the exemplary embodiment is not limited thereto. For example, the metal thin film 301 may include a multilayer formed of at least two layers. In this case, the metal thin film 301 is disposed on an outermost surface of a multilayer substrate. FIG. 3 is a schematic lateral cross-sectional view of the metal thin film 301 transported to the graphene forming apparatus 110 corresponding to a structure at a manufacturing stage III of FIG. 2.

Pre-treatment Process

In a pretreatment operation S110, a surface of the metal thin film 301 is cleaned. A pretreatment process is performed to remove foreign materials present on the surface of the metal thin film 301. The pretreatment process may be performed by using a hydrogen gas. Alternatively, the surface of the metal thin film 301 may be cleaned using an acid or alkali solution to reduce defects in a subsequent process of forming graphene 302.

The cleaning of the surface of the metal thin film 301 may be optional, and may be performed before the metal thin film 301 is wound on the reel 10.

Process of Forming Graphene

In a forming graphene operation S120, the graphene 302 is formed on the metal thin film 301 by heat treating the metal thin film 301 while injecting a gas phase carbon source onto the metal thin film 301.

Referring to FIG. 2, when the metal thin film 301 is transported to the graphene forming apparatus 110, the metal thin film 301 is heat treated by injecting the gas phase carbon source. The heat treatment is performed by heating and cooling the metal thin film 301.

The gas phase carbon source may be at least one selected from the group of materials containing carbon atom(s) consisting of $CH_4$, CO, $C_2H_6$, $CH_2$, $C_2H_5$, $C_2H_2$, $CH_3CH_2CH_3$, $C_3H_6$, $C_4H_{10}$, $CH_3(CH_2)_3CH_3$, $C_5H_{10}$, $C_5H_6$, $C_6H_{14}$, $C_6H_{12}$, $C_6H_6$, and $C_7H_8$. Carbon atoms and hydrogen atoms of the gas phase carbon source are separated at a high temperature.

The separated carbon atoms are deposited on the metal thin film 301, and become graphene 302 when the metal thin film 301 is cooled.

Figure 4:
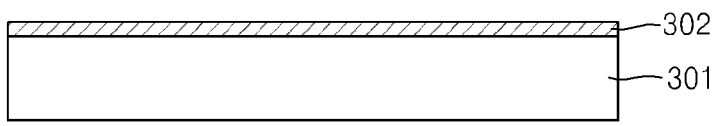
FIG. 4 is a schematic lateral cross-sectional view of the metal thin film on which graphene is formed according to pretreatment and forming graphene operations of FIG. 1 and is a lateral cross-sectional view corresponding to the structure at a manufacturing stage IV of FIG. 2, according to an exemplary embodiment.

The metal thin film 301 on which the graphene 302 is formed is transported out of the graphene forming apparatus 110 by a transporting roller 11. FIG. 4 is a lateral cross-sectional view of the metal thin film 301 on which the graphene 302 is formed corresponding to a structure at a manufacturing stage IV of FIG. 2.

The graphene forming apparatus 110 may be a device in which both heating and cooling are performed. Alternatively, heating and cooling may be performed in separate devices by configuring a plurality of apparatuses in which the heating process and the cooling process are separately performed.

In the current exemplary embodiment, although the pre-treatment process in which the cleaning of the surface of the metal thin film 301 is performed before the metal thin film 301 is transported to the graphene forming apparatus 110, the process sequence according to the exemplary embodiment is not limited thereto. For example, before injecting the gas phase carbon source onto the metal thin film 301 transported to the graphene forming apparatus 110, the metal thin film 301 may be pretreated by using the hydrogen gas. In this case, the graphene forming apparatus 110 may include a separate unit for the pretreatment process.

Post Treatment

In a carrier coating operation S130, a carrier 303 in a liquid phase is disposed on the graphene 302. Referring to FIG. 2, a stack structure of graphene 302 and the metal thin film 301 is transported to a coating roller 120 by transporting rollers 11 and 21.

The carrier 303 is coated on an outer surface of the coating roller 120 by a carrier supply unit 125. Subsequently, when the coating roller 120 rotates, the carrier 303 is coated on the graphene 302.

The coating roller 120 is disposed to with a predetermined gap from the graphene 302. Accordingly, the coating roller 120 rotates without directly contacting the graphene 302 to avoid applying a pressure to the graphene 302. Pressure is one of major factors that increase the surface resistance of the graphene 302. However, in the current exemplary carrier coating operation S130, since no pressure is applied on the graphene 302, the graphene 302 having low surface resistance and high quality can be manufactured. The distance between the coating roller 120 and the graphene 302 may be determined in consideration of the thickness of the carrier 303 to be coated on the outer surface of the coating roller 120.

The carrier 303 may be an acrylic material such as a water soluble acrylic resin or polynethylmethacrylate (PMMA). In particular, PMMA has high weather-resistance, and thus, can protect the graphene 302 from surrounding environment.

The carrier 303 may be a silicon-based material such as a silicon adhesive or polydimethylsiloxane (PDMS). In particular, PDMS also has high durability, and thus, can effectively protect the graphene 302 from surrounding environment.

The carrier 303 may be an epoxy-based material such as a water soluble epoxy or a modified epoxy resin.

Also, the carrier 303 may be a water soluble polyurethane resin, a water soluble natural polymer resin, a water-borne adhesive, a visible light hardening adhesive, an infrared ray hardening adhesive, an electron beam hardening adhesive, a polybenzimidazole (PBI) adhesive, a polyimide adhesive, an imide adhesive, a bismaleimide (BMI) adhesive, or a hot-melt adhesive.

Figure 5:
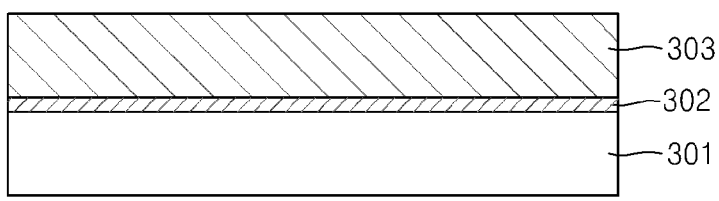
FIG. 5 is a schematic lateral cross-sectional view showing a state of graphene on which a carrier is coated according to a carrier coating operation of FIG. 1 and is a lateral cross-sectional view corresponding to the structure at a manufacturing stage V of FIG. 2, according to an exemplary embodiment.

FIG. 5 is a schematic lateral cross-sectional view showing a state of graphene 302 on which the carrier 303 is coated corresponding to a structure at a manufacturing stage V of FIG. 2. Although the carrier 303 is applied by using the coating roller 120 in exemplary embodiments, the carrier 303 may be applied in any of various other manners, such as printing.

In a hardening operation S140, the carrier 303 is hardened. Referring to FIG. 2, a stack structure including the carrier 303, the graphene 302, and the metal thin film 301 is transported to a hardening device 130 by transporting rollers 31.

The hardening device 130 may be separated by a predetermined distance from the stack structure including the carrier 303, the graphene 302, and the metal thin film 301 on a location facing the stack structure. The hardening device 130 may harden the carrier 303 coated on the graphene 302 while rotating. For example, the hardening device 130 may be a roller and may harden the carrier 303 by rotating on a fixed location or by moving a predetermined distance.

The hardening device 130 may harden the carrier 303 by radiating a predetermined amount of heat or by irradiating an infrared ray, a visible light, an ultraviolet ray, or an electron beam. For example, the hardening device 130 may radiate heat when the carrier 303 is PMMA, a water soluble acrylic resin, PDMS, an epoxy resin, a polyimide adhesive, or an imide adhesive.

The hardening device 130 may irradiate different types of light depending on a type of adhesives being used as the carrier. For example, the hardening device 130 may irradiate a visible light when the carrier 303 is a visible light hardening adhesive, an infrared ray when the carrier 303 is an infrared ray hardening adhesive, an electron beam when the carrier 303 is an electron beam hardening adhesive, or an ultraviolet ray when the carrier 303 is an ultraviolet ray hardening adhesive.

In the current exemplary embodiment, the carrier 303 is hardened by using the roller-type hardening device 130. However, the hardening of the carrier 303 according to the exemplary embodiment is not limited thereto. For example, the carrier 303 may be hardened by passing through a chamber of an oven such as a box type oven. The box type oven may also irradiate an infrared ray, a visible light, an ultraviolet ray, or an electron beam besides heat.

The carrier 303 is a medium that transports the graphene 302 to an etching space 140 and is used to maintain the shape of the graphene 302 when the metal thin film 301 is removed.

In a metal thin film removal operation S150, the metal thin film 301 is removed. For example, the metal thin film 301 may be removed via an etching process.

Referring to FIG. 2, a stack structure including the carrier 303, the graphene 302, and the metal thin film 301 is moved to the etching space 140 by transporting rollers 31, 32, and 33. For example, the etching space 140 may include a sprayer 141 to spray an etchant onto the metal thin film 301.

The etchant may be an acid solution, a hydrogen fluoride (HF), buffered oxide etch (BOE), ferric chloride ($FeCl_3$) solution, ferric nitrate ($Fe(NO_3)_3$) solution.

Figure 6:
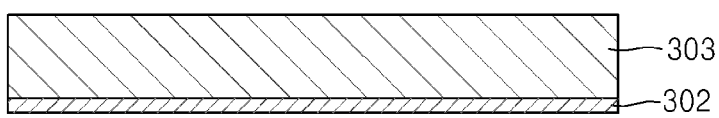
FIG. 6 is a schematic lateral cross-sectional view showing a state of stacked graphene and the carrier when the metal thin film is removed according to a metal thin film removal operation of FIG. 1, is a lateral cross-sectional view corresponding to the structure at a manufacturing stage VI of FIG. 2, and shows an overturned stack structure for convenience of explanation, according to an exemplary embodiment.

FIG. 6 is a schematic lateral cross-sectional view showing a state of a stacked structure of the graphene 302 and the carrier 303 when the metal thin film 301 is removed corresponding to the structure at a manufacturing stage VI of FIG. 2.

In a forming protective film operation S160, a protective film 700 is formed on the graphene 302. Referring to FIG. 2, a stack structure including the graphene 302 and the carrier 303 is transported towards an attaching roller 150 by transporting rollers 41 and 51.

The protective film 700 may be, for example, a polymer such as polyethylene terephthalate (PET) or polyimide (PI). The protective film 700 is formed as a film and is supplied to the stack structure of the graphene 302 and the carrier 303 by a protective film supply reel 70. When the stack structure including the graphene 302, the carrier 303 and the protective film 700 are passed through the attaching roller 150, the protective film 700 is formed on the graphene 302 on the opposite side of the graphene 302 on which the carrier 303 is formed.

Figure 7:
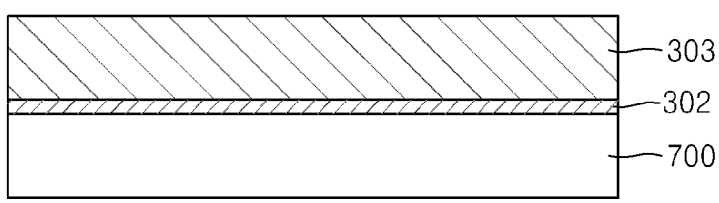
FIG. 7 is a schematic lateral cross-sectional view showing a state of graphene on which a protective film material is formed according to a forming protective film operation of FIG. 1, is a lateral cross-sectional view corresponding to the structure at a manufacturing stage VII of FIG. 2, and shows an overturned stack structure for convenience of explanation, according to an exemplary embodiment.

FIG. 7 is a schematic lateral cross-sectional view showing a stack structure including the protective film 700, the graphene 302, and the carrier 303 corresponding to the structure at a manufacturing stage VII of FIG. 2.

In a carrier removal operation S170, the carrier 303 is removed. Referring to FIG. 2, the stack structure including the protective film 700, the graphene 302, and the carrier 303 is transported towards a container 160 by transporting rollers 51.

The container 160 includes a solvent 165 for removing the carrier 303, and the carrier 303 melts away when the carrier 303 is submerged in the solvent 165.

The solvent 165 may be an alkali material. For example, when the carrier 303 is PMMA, a modified epoxy resin, a polyimide adhesive, or an imide adhesive, the solvent may be an alkali material.

The solvent may be an organic solvent. For example, when the carrier 303 is PMMA or a modified epoxy resin, the solvent may be an organic solvent such as keytone, ester, or chlorinated hydrocarbon.

Water may be used as the solvent 165. When the carrier 303 is a water soluble acrylic resin, a water soluble epoxy resin, or a water soluble polyurethane resin, the solvent 165 may be water.

Also, the solvent 165 may be an acid material according to the carrier 303.

Figure 8:
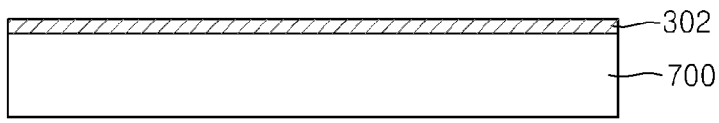
FIG. 8 is a schematic lateral cross-sectional view showing a state of the graphene when a carrier is removed according to a carrier removal operation of FIG. 1, is a lateral cross-sectional view corresponding to the structure at a manufacturing stage VIII of FIG. 2, and shows an overturned stack structure for convenience of explanation, according to an exemplary embodiment.

FIG. 8 is a schematic lateral cross-sectional view showing a state of showing a state of the graphene when a carrier is removed according to the carrier removal operation S170 corresponding to a structure at a manufacturing stage VIII of FIG. 2.

In a winding operation S180, the graphene 302 on which the protective film 700 is formed is wound using a winding reel 20.

According to another exemplary embodiment, a stack structure including the metal thin film 301 and the graphene 302 may be formed separately from the above exemplary method described above. For example, the graphene 302 may be formed as the metal thin film 301 mounted on a conveyor belt passes through the graphene forming apparatus 110. After the stack structure including the metal thin film 301 and the graphene 302 is formed separately and wound on the reel 10, a post treatment process begins when the metal thin film 301 is transported to the coating roller 120 by the reel 10 and the transporting roller 11 and 21. The post treatment process is that same as the operations S130 through S170 described above.

Figure 9:
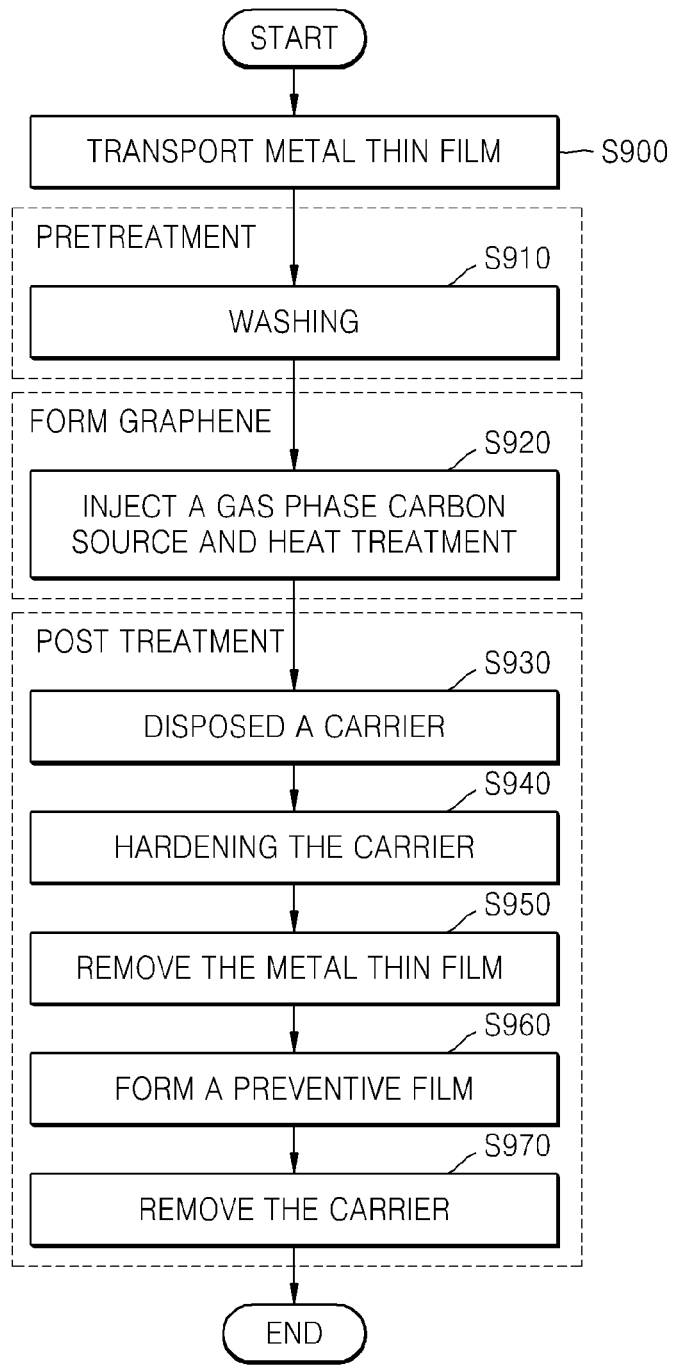
FIG. 9 is a flow chart illustrating a method of manufacturing graphene according to another exemplary embodiment.

FIG. 9 is a schematic diagram illustrating a method of manufacturing graphene using a panel-type method. The aforementioned panel-type method indicates that at least one operation of manufacturing graphene is performed by using a transporting unit such as a conveyer belt.

In the method of manufacturing graphene according to the present exemplary embodiment, a case where manufacturing operations S900 to S960 are performed by a conveyer belt to manufacture the graphene, will be described.

Figure 10:
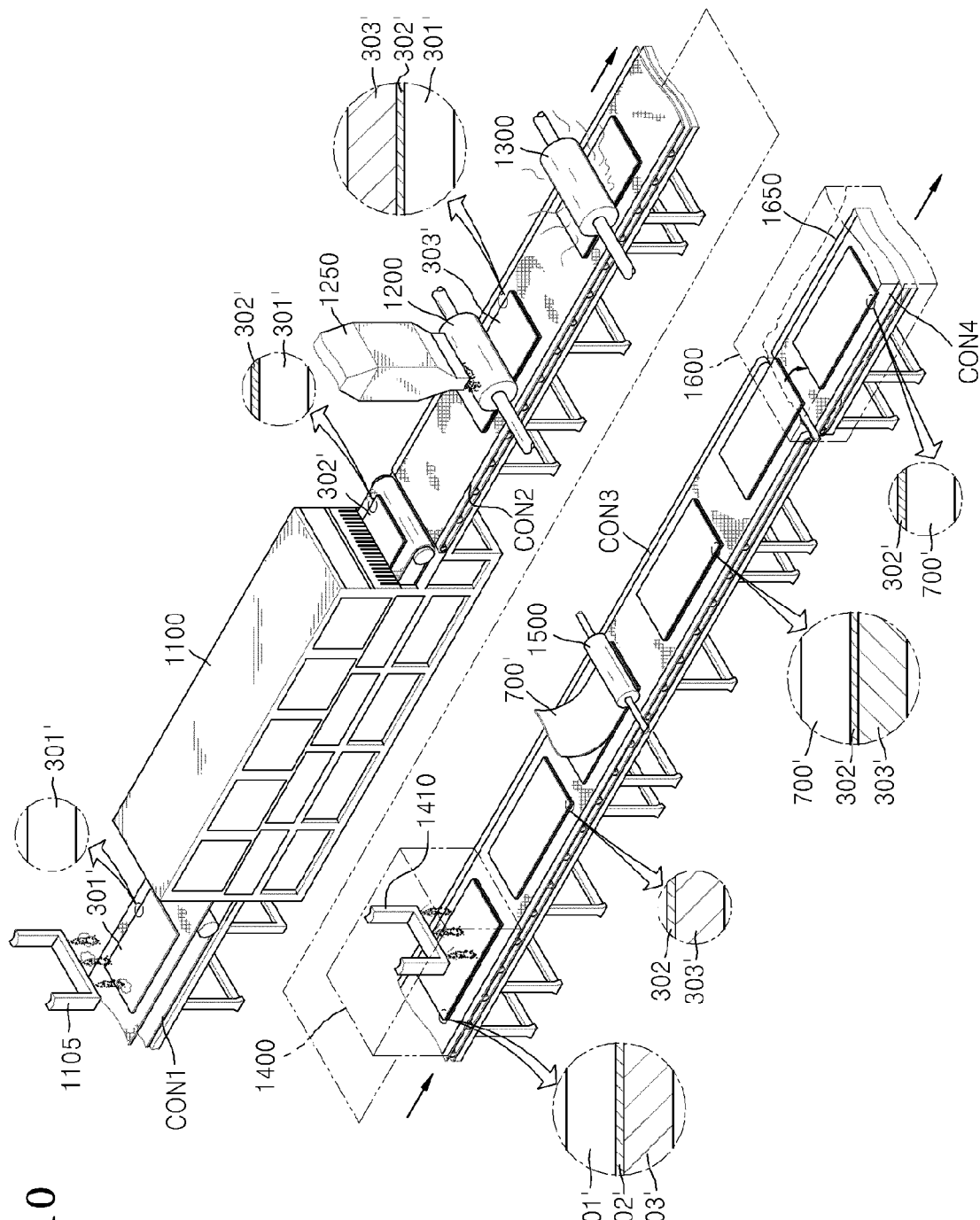
FIG. 10 is a schematic diagram showing the method of manufacturing graphene shown in FIG. 9 using a panel-type method, according to another exemplary embodiment.

Referring to FIGS. 9 and 10, a method of post treating graphene according to an exemplary embodiment may be described with reference to operations S930 through S970 in the method of manufacturing graphene, and thus detailed description of the method of post treating graphene will be replaced with the description of the operations S930 through S970 in the method of manufacturing graphene.

In a transporting operation S900, a flat-panel type metal thin film 301' is transported by using a conveyer CON1. Referring to FIG. 10, the flat-panel type metal thin film 301' accommodated on the conveyer CON1 is transported toward a graphene forming apparatus 1110. Although the metal thin film 301 is continuously supplied by the reel 10 as described above with reference to FIGS. 1 through 8, a plurality of the flat-panel type metal thin films 301' are supplied at a predetermined interval according to the present exemplary embodiment.

In the present embodiment, the flat-panel type metal thin film 301' may be formed of at least one selected from a group consisting of Ni, Co, Fe, Pt, Au, Al, Cr, Cu, Mg, Mn, Mo, Ro, Si, Ta, Ti, and W.

Figure 11A:
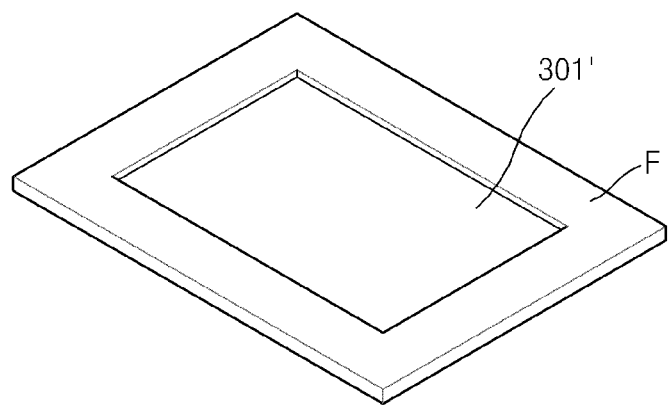
FIGS. 11A and 11B are schematic perspective views of a metal thin-film according to an operation S900 of FIG. 9, according to another exemplary embodiment.
Figure 11B:
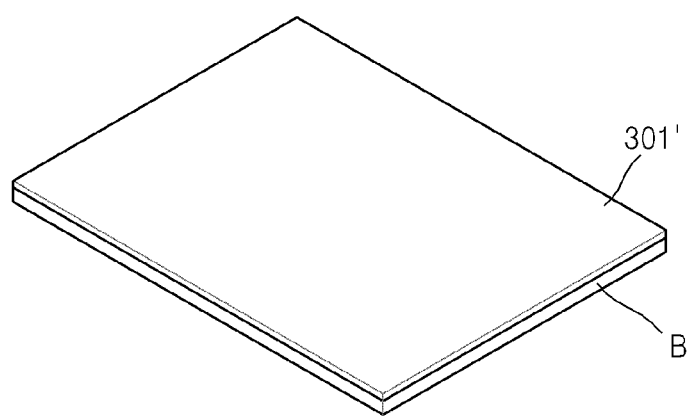

Although a case in which the flat-panel type metal thin film 301' has a panel-like shape and has a single layer is shown in FIG. 10 according to the present embodiment, the exemplary embodiment is not limited thereto. For example, a frame F may be arranged on edges of the flat-panel type metal thin film 301' as shown in FIG. 11A, or a base member B may be arranged below the flat-panel type metal thin film 301' as shown in FIG. 11B so that the flat-panel type metal thin film 301' becomes one of a plurality of layers of a multi-layer substrate. The exemplary embodiments according to FIG. 11A or 11B may improve handling of the substrate in graphene manufacturing processes.

Pre-Treating Operation

In a pre-treating operation S910, surfaces of the flat-panel type metal thin film 301' are cleaned to remove impurities. Surfaces of the metal thin film 301' are cleaned by using a hydrogen gas or acid/alkali solution supplied by a pre-treating device 1105.

Process of Forming Graphene

In a forming graphene operation S920, a graphene 302' is formed on the flat-panel type metal thin film 301' by heat treating the metal thin film 301' while injecting a gas phase carbon source onto the metal thin film 301'.

Operations for forming a graphene are same as the operations described above with reference to FIGS. 1, 2, and 4, and thus detailed descriptions thereof will be omitted.

In the present exemplary embodiment, the pre-treating operation for cleaning surfaces of the metal thin film 301' is performed before the metal thin film 301' is transported to the graphene forming apparatus 1100 is provided. However, the present exemplary embodiment is not limited to such sequence. For example, the flat-panel type metal thin film 301' may be transported to the graphene forming apparatus 1100 and may be pre-processed by using the hydrogen gas, for example, before the gas phase carbon source is supplied to the flat-panel type metal thin film 301'.

The flat-panel type metal thin film 301' on which the graphene 302' is formed is carried out of the graphene forming apparatus 1100 by the conveyer CON1 and is transported toward a coating roller 1200.

Post Treatment

In a carrier coating operation S930, a liquid phase carrier 303' is disposed on the graphene 302'. Referring to FIG. 10, a stack structure including the graphene 302' and the metal thin film 301' is transported by a conveyer CON2 toward the coating roller 1200.

The liquid phase carrier 303' is applied to an outer surface of the coating roller 1200 by a carrier supply unit 1250. Subsequently, as the coating roller 1200 rotates, the liquid phase carrier 303' is applied onto the graphene 302'. The carrier 303' may be formed of one selected from the group consisting of an acrylic material, a silicon-based material, and an epoxy-based material, as described above.

The coating roller 1200 is arranged to be a predetermined distance apart from the graphene 302'. Therefore, since the coating roller 1200 rotates without directly contacting the graphene 302', the coating roller 1200 does not apply pressure to the graphene 302'. Pressure is one of the major factors for increasing surface resistance of the graphene 302'. However, according to the present exemplary embodiment, no pressure is applied to the graphene 302' while the carrier 303' is being applied, and thus the graphene 302' with small surface resistance and excellent quality may be manufactured. The distance between the coating roller 1200 and the graphene 302' may be determined in consideration of the thickness of the carrier 303' applied to the outer surface of the coating roller 1200.

Although the liquid phase carrier 303' is applied by using the coating roller 1200 as described in the present exemplary embodiment, the carrier 303' may be applied in any of various other manners, such as printing.

In a hardening operation S940, the liquid phase carrier 303' is hardened. Referring to FIG. 10, a stack structure including the liquid phase carrier 303', the graphene 302', and the metal thin film 301' is transported toward the hardening device 1300 by the conveyer CON2.

The hardening device 1300 is arranged to be a predetermined distance apart from the stack structure and to face the stack structure and hardens the liquid phase carrier 303' by emitting heat, light, or electron beam, as described above.

Although the liquid phase carrier 303' is hardened by using the hardening device 1300 is described in the present exemplary embodiment, the present exemplary embodiment is not limited thereto. For example, a chamber, such as a box-type oven, may be arranged, such that the liquid phase carrier 303' is hardened as it passes through the camber. The box-type oven may also emit heat, infrared ray, ultraviolet ray, visible rays, or electron beam.

The carrier 303' not only transports the graphene 302' into an etching space 1400, but also maintains a shape of the graphene 302' during removal of the flat-panel type metal thin film 301'.

In a metal thin film removal operation S950, the flat-panel type metal thin film 301' is removed. For example, the flat-panel type metal thin film 301' may be removed by etching.

Referring to FIG. 10, the structure including the carrier 303', the graphene 302', and the flat-panel type metal thin film 301' is arranged on a conveyer CON3 to expose the flat-panel type metal thin film 301' and is transported to an etching space 1400. The etching space 1400 may include a spray unit 1410 for spraying an etchant to the metal thin film 301'. The etchant may be an acid, a HF, BOE, $FeCl_3$ solution, $Fe(NO_3)_3$ solution, etc., as described above.

In a forming protective film operation S960, a protective film 700' is formed on the graphene 302'

Referring to FIG. 10, when a stack structure including the protective film 700' and the graphene 302' passes through an attaching roller 1500, a protective film 700 is formed on the graphene 302' on the opposite side of the graphene 302' on which the carrier 303' is formed. The protective film material 700' may be a polymer, e.g., polyethylene terephthalate (PET), polyimide (PI), etc.

The protective film 700' may be provided with a same size as the panel-like structure including the graphene 302' and the carrier 303' by the attaching roller 1500. Alternatively, the protective film material 700' may be provided with a size larger than that of the panel-like structure including the graphene 302' and the carrier 303', and then the protective film material 700' may be cut as the same size as the panel-like structure.

A structure in which the protective film 700', the graphene 302', and the carrier 303' are sequentially stacked is transported toward a container 160 by the conveyer CON3. The container 1600 is filled with a solvent 1650 for removing the carrier 303'. The structure including the protective film 700', the graphene 302', and the carrier 303' transported to the container 1600 may be moved by a conveyer CON4 in the container 1600.

As described above, the solvent 1650 may be an alkali material, an organic solvent, water, or an acid material according to type of the carrier 303'

The structure including the protective film 700' and the graphene 302', from which the carrier 303' is removed, may be carried out of the container 1600 and dried.

Figure 12:
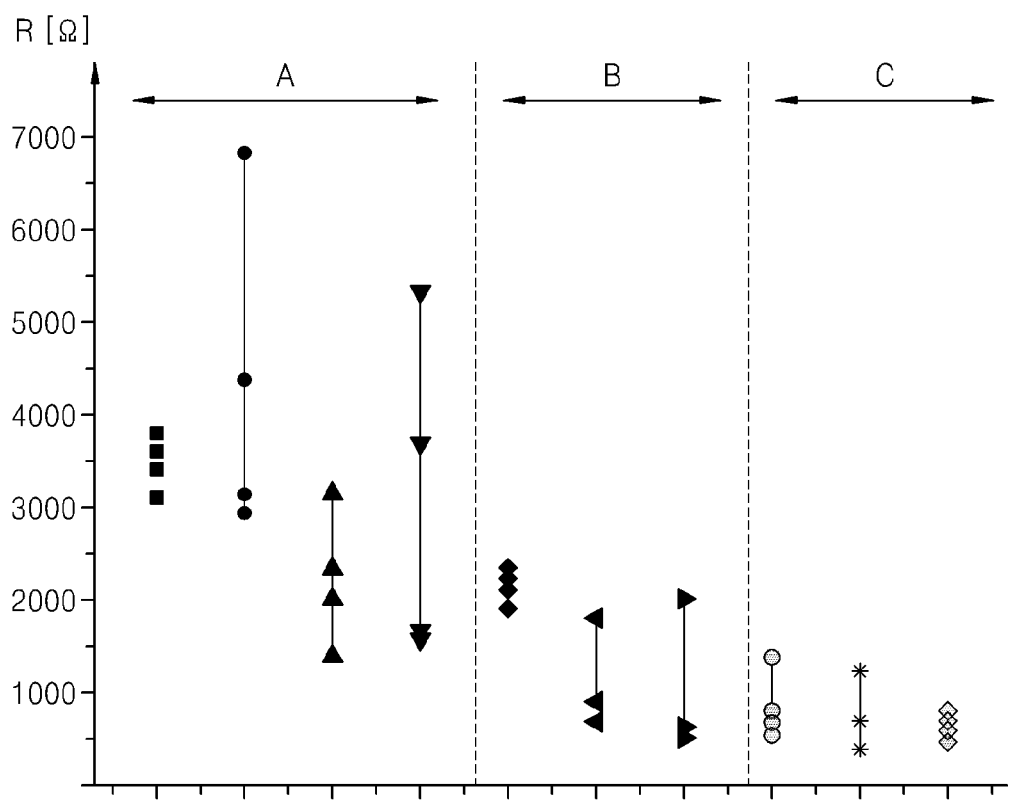
FIG. 12 is a graph showing a surface resistance according to the number of times of pressure being applied to graphene, according to another exemplary embodiment.

FIG. 12 is a graph illustrating various ranges of a surface resistance R according to a number of times of pressure being applied to a graphene. A section A in FIG. 12 indicates a measured range of the surface resistance R when pressure is applied twice to the graphene, a section B indicates a measured range of the surface resistance R i when pressure is applied once to the graphene, and a section C indicates a measured range of the surface resistance R without applying pressure to the graphene.

Referring to FIG. 12, when the pressure is applied twice to the graphene, the surface resistance R is approximately between 2,000Ω and 5,000Ω, and when the pressure is applied once to the graphene, the surface resistance R is approximately between 1,000Ω and 2,000 Ω.

According to the present exemplary embodiment, since the graphene 302 or 302' is formed using the liquid phase carrier 303 or 303' to avoid applying any unnecessary pressure, the graphene 302 or 302' has a surface resistance R of approximately 1,100Ω or less as shown in the section C. Therefore, the conductivity and electrical characteristics of the graphene 302 or 302' are further improved.

While exemplary embodiments have been particularly shown and described above, it will be understood by one of ordinary skill in the art that various changes in form and details may be made therein without departing from the spirit and scope of the present inventive concept as defined by the following claims.

What is claimed is:

1. A method of post treating graphene, the method comprising:
   providing graphene on a metal thin film;
   providing a carrier on the graphene, the providing the carrier comprising:
      supplying the carrier onto an outer surface of a coating roller; and
      coating the supplied carrier onto the metal thin film by the coating roller without having the coating roller contact the graphene;
   hardening the carrier; and
   removing the metal thin film from the graphene,
   wherein the coating roller is disposed to be separated by a predetermined distance from the graphene and configured to avoid applying pressure to the graphene.

2. The method of claim 1, wherein the metal thin film comprises a panel-like shape, and
   the post treating graphene is performed while a transporting unit is configured to transport the metal thin film.

3. The method of claim 1, wherein the providing the carrier comprises printing or coating the carrier on the graphene.

4. The method of claim 1, wherein the carrier is one selected from the group consisting of an acrylic material, a silicon-based material, and an epoxy-based material.

5. A method of post treating graphene, the method comprising:
   providing graphene on a metal thin film;
   providing a carrier on the graphene;
   hardening the carrier; and
   removing the metal thin film from the graphene,
   wherein the hardening the carrier comprises hardening the carrier using a hardening device comprising:
      a hardening roller separated by a predetermined distance from the carrier and configured to emit heat or light to the carrier, the hardening roller configured to harden the carrier by rotating on a fixed location; and
      a transporting roller.

6. A method of manufacturing graphene comprising:
   transporting a metal thin film to a graphene forming apparatus;
   providing graphene on the metal thin film;
   providing a carrier on a first surface of the graphene, the providing the carrier comprising:
      supplying the carrier onto an outer surface of a coating roller; and
      coating the supplied carrier onto the metal thin film by the coating roller without having the coating roller contact the graphene;
   hardening the carrier;
   removing the metal thin film from the graphene; and
   providing a protective film on a second surface of the graphene,
   wherein the coating roller is disposed to be separated by a predetermined distance from the graphene and configured to avoid applying pressure to the graphene.

7. The method of claim 6, wherein the post treating of graphene is performed using a reel-to-reel method.

8. The method of claim 6, further comprising removing the carrier from the graphene provided with the protective film.

9. A graphene post-treated according to the method of claim 1.

10. A graphene manufactured according to the method of claim 6.

11. The method of claim 1, wherein the carrier comprises a liquid phase carrier.

12. The method of claim 5, wherein the hardening the carrier comprises hardening the carrier using the hardening roller configured to avoid applying pressure to the graphene while rotating.

13. The method of claim 6, wherein the carrier comprises a liquid phase carrier.

14. The method of claim 1, wherein the carrier is coated on the graphene in response to the coating roller rotating.

15. The method of claim 14, wherein the carrier is coated on the coating roller before the carrier is coated on the coating roller.

16. The method of claim 6, wherein the carrier is coated on the graphene in response to the coating roller rotating.

17. The method of claim 16, wherein the carrier is coated on the coating roller before the carrier is coated on the coating roller.

18. The method of claim 5, wherein the carrier is provided between the hardening roller and the transporting roller in a carrier thickness direction.

* * * * *